(12) United States Patent
Hsu et al.

(10) Patent No.: US 11,948,776 B2
(45) Date of Patent: Apr. 2, 2024

(54) PLASMA PROCESSING APPARATUS

(71) Applicant: Hitachi High-Tech Corporation, Tokyo (JP)

(72) Inventors: Chen Pin Hsu, Tokyo (JP); Hitoshi Tamura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/641,503

(22) PCT Filed: Jan. 21, 2021

(86) PCT No.: PCT/JP2021/002037
§ 371 (c)(1),
(2) Date: Mar. 9, 2022

(87) PCT Pub. No.: WO2022/157883
PCT Pub. Date: Jul. 28, 2022

(65) Prior Publication Data
US 2023/0352273 A1 Nov. 2, 2023

(51) Int. Cl.
*H01J 37/00* (2006.01)
*H01J 37/32* (2006.01)
*H05H 1/46* (2006.01)

(52) U.S. Cl.
CPC .. *H01J 37/32229* (2013.01); *H01J 37/32266* (2013.01); *H01J 37/32495* (2013.01);
(Continued)

(58) Field of Classification Search
CPC ........... H01J 37/32192; H01J 37/32311; H01J 37/32229; H01J 37/32226; H01J 37/32495; H01L 21/6831
See application file for complete search history.

(56) References Cited

U.S. PATENT DOCUMENTS 5,024,716 A * 6/1991 Sato ................... H01J 37/32192
204/298.37
6,764,606 B2 * 7/2004 Yanase .............. H01J 37/32238
216/75
(Continued)

FOREIGN PATENT DOCUMENTS

JP   H01134926 A   5/1989
JP   2005050776 A   2/2005
(Continued)

OTHER PUBLICATIONS

Search Report dated Apr. 6, 2021 in International Application No. PCT/JP2021/002037.
(Continued)

*Primary Examiner* — Tuan T Lam
(74) *Attorney, Agent, or Firm* — Miles & Stockbridge, P.C.

(57) ABSTRACT

A plasma processing apparatus adapted to reduce non-uniformity of plasma distribution in a process chamber and to adjust the plasma distribution to "centrally high density", "circumferentially high density", or "uniform density" in accordance with a desired etching process, a process chamber; a radio frequency power source; a rectangular waveguide; and a circular waveguide connected to the rectangular waveguide, in which the rectangular waveguide includes an upper rectangular waveguide and a lower rectangular waveguide formed by vertically dividing the rectangular waveguide; and a cutoff section which cuts off the microwave frequency power and which has a dielectric body. The circular waveguide includes an inner waveguide connected to the upper rectangular waveguide and formed inside; and an outer waveguide connected to the lower rectangular waveguide and formed on an outer side of the inner wave-
(Continued)

guide. The cutoff section has a width narrower than those of the rectangular waveguides except the cutoff section.

7 Claims, 6 Drawing Sheets

(52) U.S. Cl.
CPC .......... *H05H 1/46* (2013.01); *H01J 37/32311* (2013.01); *H01J 2237/334* (2013.01)

(56) References Cited

U.S. PATENT DOCUMENTS

| | | | | |
|---|---|---|---|---|
| 7,807,019 B2* | 10/2010 | Ishii | ................... | H01J 37/3222 |
| | | | | 118/723 MW |
| 9,583,314 B2* | 2/2017 | Tamura | ................... | H01J 37/02 |
| 9,761,418 B2* | 9/2017 | Shintaku | ........... | H01J 37/32275 |
| 10,546,725 B2* | 1/2020 | Hirano | ............... | H01J 37/32211 |
| 10,665,428 B2* | 5/2020 | Aita | .................. | H01J 37/32229 |
| 2012/0186747 A1 | 7/2012 | Obama et al. | | |
| 2016/0141151 A1* | 5/2016 | Tamura | ............. | H01J 37/32256 |
| | | | | 315/111.21 |
| 2017/0350014 A1 | 12/2017 | Iwao et al. | | |
| 2022/0344132 A1* | 10/2022 | Hsu | .................. | H01J 37/32229 |
| 2022/0359162 A1* | 11/2022 | Tamura | ............. | H01J 37/32311 |

FOREIGN PATENT DOCUMENTS

| | | |
|---|---|---|
| JP | 2012178380 A | 9/2012 |
| JP | 2019110028 A | 7/2019 |
| WO | 2016104205 A1 | 6/2016 |

OTHER PUBLICATIONS

Written Opinion dated Apr. 6, 2021 in International Application No. PCT/JP2021/002037.

* cited by examiner

PLASMA PROCESSING APPARATUS

TECHNICAL FIELD

The present invention relates to a plasma processing apparatus which produces plasma by means of electromagnetic waves.

BACKGROUND ART

With an increase in the degree of integration of semiconductor devices, the development of high aspect ratio etching technologies has been promoted. Dry etching technique is one of the microfabrication etching techniques in the semiconductor field. Above all, a dry etching process using plasma is commonly used. Plasma generates ions and radicals by exciting molecules or atoms of a processing gas by means of collision between electrons and the molecules or atoms of the processing gas. A plasma etching apparatus (hereinafter, also referred to as "plasma processing apparatus") performs anisotropic etching by means of ions and performs isotropic etching by means of radicals. ECR (Electron Cyclotron Resonance) is used as a plasma source. Having a capability of producing high density plasma, the ECR is used for increasing dielectric withstanding voltage of DRAM of the semiconductor device or for producing high capacity capacitors.

A configuration of an ECR plasma etching apparatus 100r according to a comparative example is shown in FIG. 1. A 2.45-GHz microwave emitted from a magnetron as a single microwave source propagates through a rectangular waveguide 14, a circular rectangular converter 141, and a circular waveguide 142 to be introduced into a process chamber 13 through a quartz window 15 at an upper part of the process chamber 13 provided with an electromagnetic coil 12 on an outer side thereof. An electron cyclotron motion is caused by the electric field induced by the microwaves and a magnetic field formed in a vertical direction with respect to the electric field. In a case where the frequency of the microwaves is 2.45 GHz, a travelling direction of the electrons vertical to the magnetic field is bent by the Lorentz force so that the electrons are made to perform a revolving motion by little and little. A magnetic flux density B at this time is expressed by an equation $fc = eB/2\pi me$ where "e" denotes an electric charge of electrons $e = 1.6 \times 10^{-19}$ C, "me" denotes an electron mass $9.1 \times 10^{-31}$ Kg, and "fc" is 2.45 GHz). Given 875 G, the electron cyclotron resonance occurs, leading to the increase in the probability of collision between the electrons and gas molecules in the process chamber. Hence, high density plasma can be produced even under low pressure. An operating pressure is 1 Pa or so. In this pressure region, plasma having a density of $10^{11}$ cm$^{-3}$ or more can be obtained. Plasma formation and independent ion energy can be controlled by means of an RF power source 17 which applies electric power to a lower electrode 16.

Hence, precise plasma shape control can be ensured. For the purpose of enhancing in-plane uniformity of a processed substrate 11, a circular polarized wave generator 19 formed of a dielectric material is used for introducing circular polarized waves into the process chamber 13. Thus, the circular polarized waves are also formed in the process chamber 13 so that more uniform plasma distribution can be obtained.

CITATION LIST

Patent Literature

PTL 1: Japanese Patent Application Laid-Open No. Hei 1-134926
PTL 2: Japanese Patent Application Laid-Open No. 2005-050776

SUMMARY OF INVENTION

Technical Problem

It is generally known that plasma density on wall surfaces of the process chamber of the plasma processing apparatus is lower than that at the center of the process chamber because of loss by reaction on solid surface. Such non-uniformity of plasma density distribution results in non-uniform etching rate on the processed substrate.

According to Patent Literature 1, a single microwave power source is introduced into the process chamber by means of a branched rectangular waveguide in order to improve the non-uniformity of plasma distribution in a process chamber for large-diameter substrate. However, a measure against the annihilation of ions and radicals due to the solid surface reactions on the wall surfaces of the process chamber has not yet been applied.

Patent Literature 2 takes the following approach to improve an etching rate distribution on the processed substrate. That is, two rectangular waveguides are orthogonally arranged to control the phase of the inputted microwaves by adjusting the lengths of the two rectangular waveguides in orthogonal relation. The circular polarized waves of the microwaves are formed before introduced into the process chamber. However, this approach cannot handle the annihilation of ions and radicals on the wall surfaces of the process chamber, as heretofore faced by the conventional apparatuses. Naturally, the problem concerning the higher plasma density at the center of the process chamber remains to be resolved.

In a semiconductor device fabrication process, the etching rate of the processed substrate does not necessarily depend upon the plasma density. In a case where priority is given to a process condition such as heat distribution, for example, the in-plane uniformity of an etching surface on the processed substrate can be finally achieved if the plasma density can be adjusted in the order of "circumferentially high density", "centrally high density" and "uniform density" in one process cycle.

In the case of thin film etching for semiconductor devices, a thin film formed on the processed substrate often suffers non-uniform thicknesses due to characteristics such as exhaust conductance of a thin film forming apparatus, symmetric property of the process chamber, and the like. In a case where the film thickness is characterized by a convex shape distribution where the film thickness is large at the center but small at the circumferences, large input power of microwaves above the center of the processed substrate is required. In a case where the film thickness is characterized by a concave shape distribution where the thickness is small at the center but large at the circumferences, on the other hand, the input power of microwaves at the center of the processed substrate must be reduced. As described above, there is a variety of factors for achieving the in-plane uniformity. Therefore, the etching apparatuses using plasma are required to control the plasma density distribution with higher degree of freedom.

According to the ECR plasma etching apparatus 100r shown in FIG. 1, the apparatus 100r contains therein the circular polarized wave generator 19 formed of the dielectric blocks. When the plasma density in the process chamber 13 of the ECR plasma etching apparatus 100r is changed according to the process condition, the position of the circular polarized wave generator 19 must be adjusted for impedance matching. However, the circular polarized wave generator 19 is covered with the electromagnetic coil 12. This makes the positional adjustment of the circular polarized wave generator difficult.

It is an object of the present invention to provide a plasma processing apparatus which is adapted to reduce the non-uniformity of the plasma distribution in the process chamber and to adjust the plasma distribution in the process chamber to "centrally high density", "circumferentially high density", or "even density distribution" according to a desired etching process.

The other problems and novel features will become apparent from the following description and the accompanying drawings of the specification.

Solution to Problem

Typical aspects of the present invention will be briefly outlined as below.

According to one embodiment, a plasma processing apparatus includes:
- a process chamber in which a specimen is plasma treated;
- a radio frequency power source for supplying microwave frequency power for plasma production;
- a rectangular waveguide for transmitting microwaves;
- a circular waveguide connected to the rectangular waveguide and transmitting the microwaves to the process chamber; and
- a specimen support on which a specimen is placed, and has a configuration wherein
    the rectangular waveguide includes: an upper rectangular waveguide and a lower rectangular waveguide formed by vertically dividing the rectangular waveguide; and a cutoff section which cuts off the microwave frequency power supplied from the radio frequency power source, and which is provided with a dielectric body.

The circular waveguide includes: an inner waveguide connected to the upper rectangular waveguide and formed inside; and an outer waveguide connected to the lower rectangular waveguide and formed on the outer side of the inner waveguide.

A width of the cutoff section is smaller than those of the rectangular waveguides except for the cutoff section.

Advantageous Effects of Invention

The plasma processing apparatus according to one embodiment is adapted to reduce the non-uniformity of plasma distribution in the process chamber and to adjust the plasma distribution in the process chamber to "centrally high density", "circumferentially high density", or "uniform density" in accordance with a desired etching process.

DESCRIPTION OF EMBODIMENTS

Figure 1:
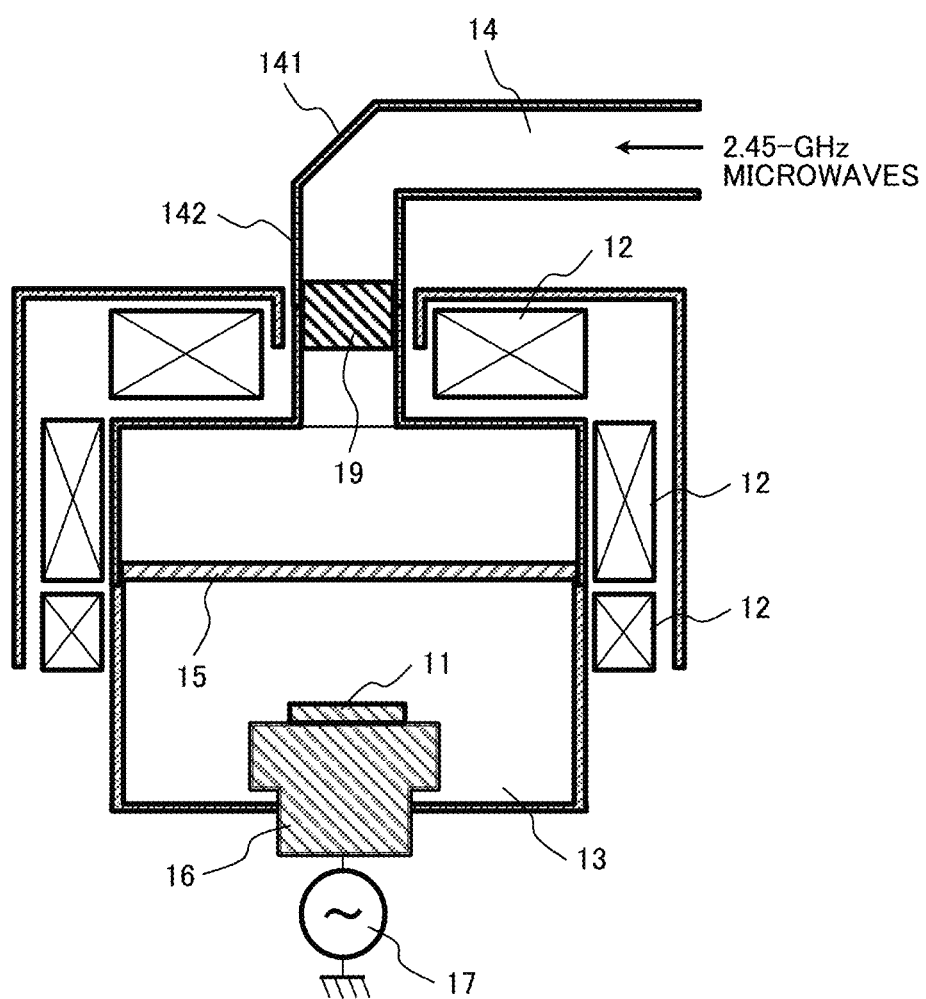
FIG. 1 is a schematic vertical cross-sectional view showing an ECR plasma etching apparatus according to a comparative example.

The examples will hereinbelow be described with reference to the accompanying drawings. In the following description, however, the same or similar reference numerals are used to refer to the same or similar components which are explained only once in some cases to avoid repetitions. For greater clarity, there are cases where the drawings provide more schematic illustrations of some parts than those in practical modes. However, the drawings are meant only for an example but not meant to limit the interpretation of the present invention.

Example 1

Figure 2:
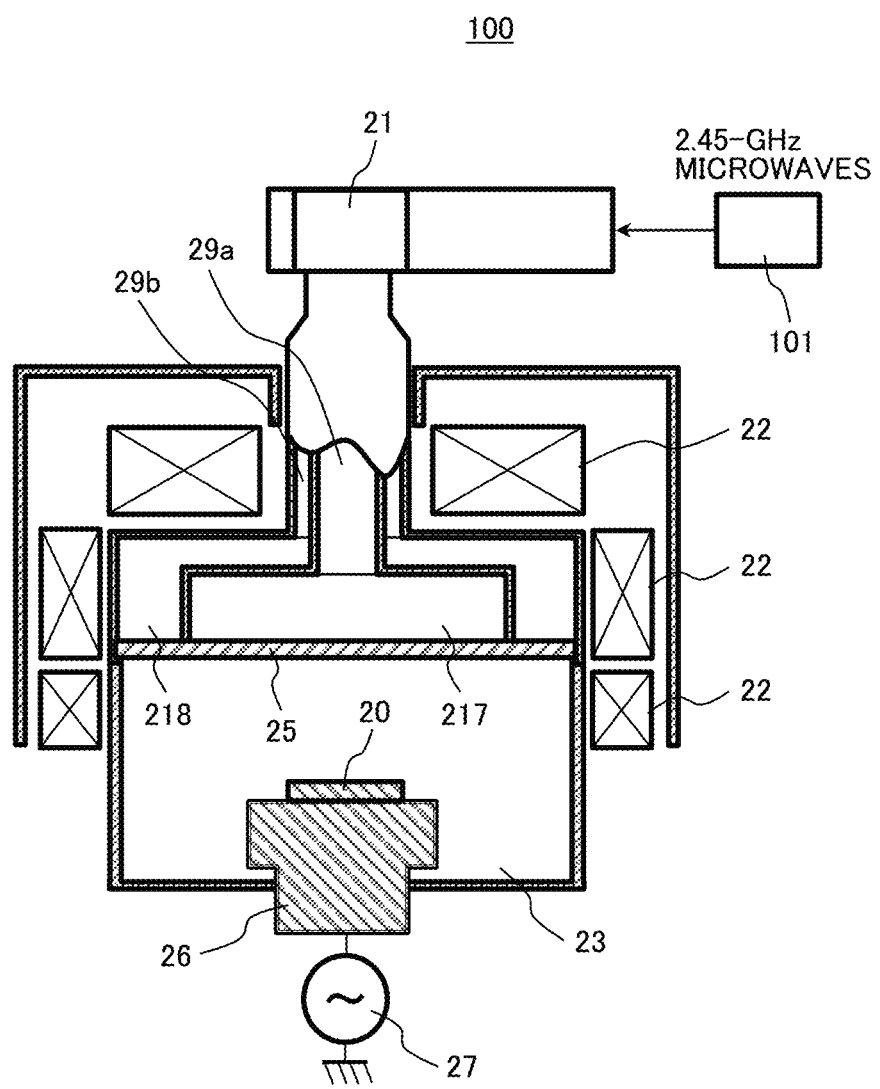
FIG. 2 is a schematic vertical cross-sectional view showing an overall structure of an ECR plasma etching apparatus according to the present invention.
Figure 3:
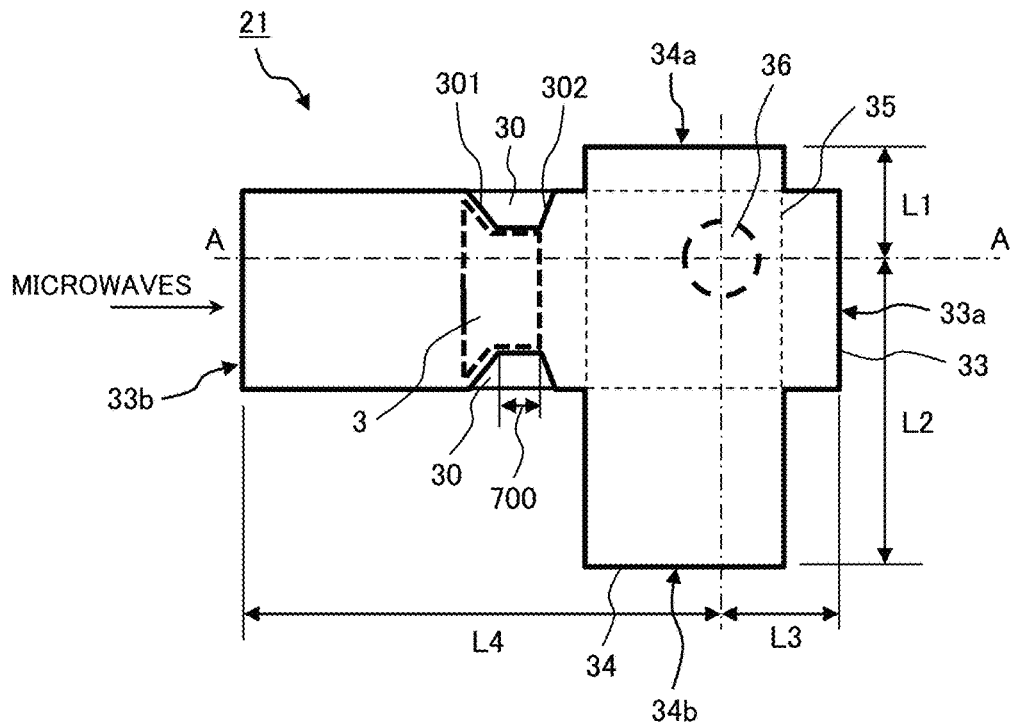
FIG. 3 is a top view showing a structure of a waveguide for microwave power adjustment according to the present invention.
Figure 4:
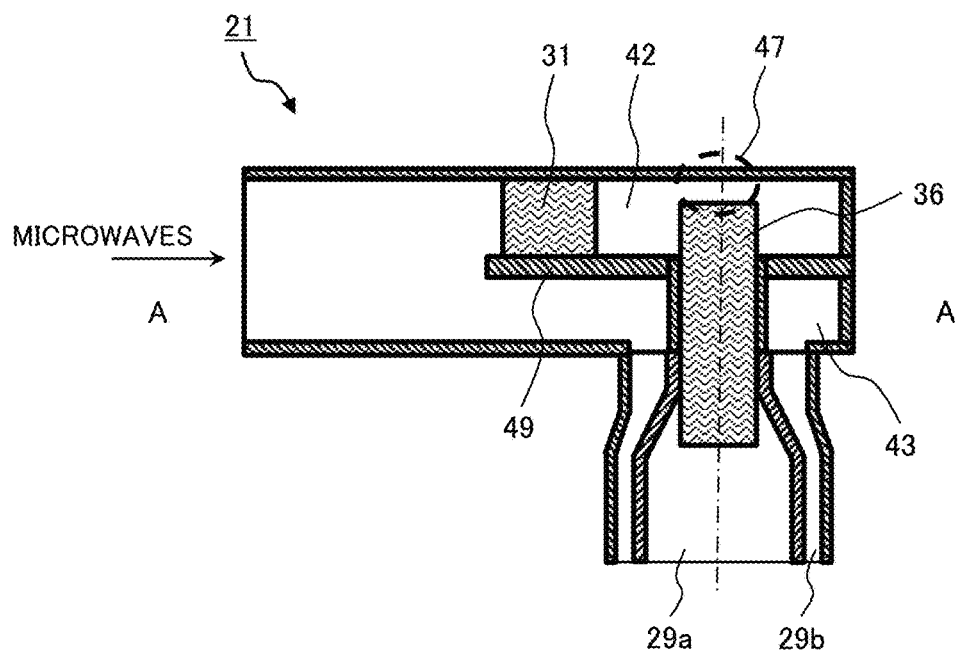
FIG. 4 is a sectional view of the structure of the waveguide taken on the line A-A in FIG. 3.
Figure 5A:
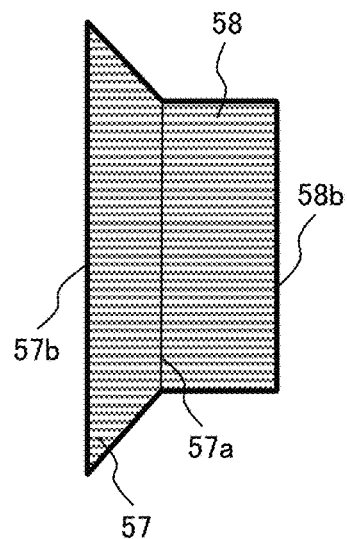
FIG. 5A is a top view illustrating an outside configuration of the power gate shown in FIG. 3.
Figure 5B:
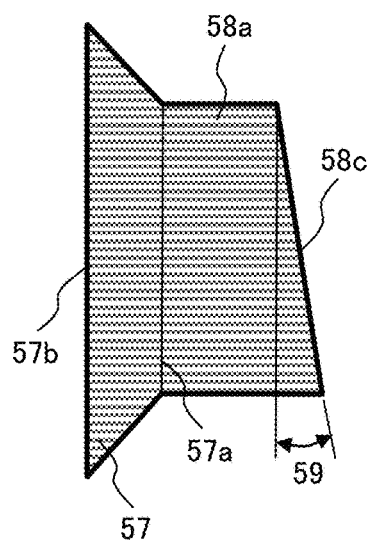
FIG. 5B is a top view illustrating an outside configuration of a power gate according to a modification.

A microwave plasma etching apparatus according to the present invention will hereinbelow be described with reference to the accompanying drawings. FIG. 2 is a schematic vertical cross-sectional view showing an overall structure of an ECR plasma etching apparatus according to the present invention. FIG. 3 is a top view showing a structure of a waveguide for microwave power adjustment according to the present invention. FIG. 4 is a sectional view showing the structure of the waveguide taken on the line A-A in FIG. 3. FIG. 5A is a top view of a power gate shown in FIG. 3. FIG. 5B is a top view of a power gate according to a modification.

As shown in FIG. 2, a microwave plasma etching apparatus 100 according to the present invention includes a microwave power divider 21 disposed above a process chamber 23. The microwave power divider introduces 2.45-GHz microwave power from a magnetron as a single microwave power source (radio frequency power source) 101 into each of a circular inner waveguide 29a and a circular outer waveguide 29b. The circular inner waveguide 29a and the circular outer waveguide 29b can be called as circular waveguides. The circular inner waveguide 29a is connected to an inner radiation section 217. The outer waveguide 29b is connected to a ring-shaped outer radiation section 218. The magnetron as the microwave power source (radio frequency power source) 101 supplies microwave frequency power for plasma production.

A quartz window 25 is disposed between the process chamber 23 and the two radiation sections 217, 218. An outer periphery of the process chamber 23 is covered with an electromagnetic coil 22. A lower electrode 26 as a specimen support on which a processed substrate (specimen) such as a semiconductor wafer is placed is disposed at a central bottom surface of the process chamber 23. The lower electrode 26 is connected to an RF power source 27 for accelerating ions in plasma. Processing gas ions ionized in the plasma are accelerated toward the processed substrate 20 by changing the voltage of the RF power source 27, thus removing a thin film on the processed substrate 20.

The microwave power divider 21 introduces the circular polarized waves into each of the inner waveguide 29a and the outer waveguide 29b so that the microwave power in the form of the circular polarized waves is injected into the process chamber 23 via the inner radiation section 217 and the ring-shaped outer radiation section 218. A TEM mode microwaves infiltrate an output end of the outer waveguide 29b (coaxial section) so that an axial ratio of the circular polarized waves decreases at a radiation end of the outer waveguide 29b. However, the infiltrative microwaves in the TEM mode are removed by utilizing a cavity resonance effect of the ring-shaped outer radiation section 218. Since the TEM mode of the outer waveguide 29b can be removed by means of the ring-shaped outer radiation section 218, the axial ratio of the outer waveguide 29b is evaluated by using an S parameter in TE11 mode.

In the inner radiation section 217 defining a space having a larger diameter than that of the inner waveguide 29a, a mode other than the TE11 mode can be established. Since this electric field can be temporarily rotated, the influence of the reflective waves in the form of TE11 mode can be reduced. While the illustrated inner radiation section 217 is defined by a cylindrical space, the inner radiation section may also be defined by cuboid or polygon such as hexahedron or octahedron. Namely, the inner radiation section may have any shape that permits the establishment of a mode of higher order than that of the TE11 mode. Next, the details of the microwave power divider 21 are described with reference to FIG. 3 and FIG. 4.

FIG. 3 shows a top view of the microwave power divider 21 shown in FIG. 2. As shown in FIG. 3, the microwave power divider 21 includes a long rectangular waveguide a (first rectangular waveguide) 33 and a short rectangular waveguide b (second rectangular waveguide) 34 orthogonal thereto (or intersecting therewith). Both the rectangular waveguide a33 and the rectangular waveguide b34 can be formed by using EIAJ standard WR1-22 waveguide (width: 109.2 mm, height: 54.6 mm). FIG. 4 shows a sectional view taken on the line A-A in FIG. 3. As shown in the sectional view of FIG. 4, the rectangular waveguide a33 and the waveguide b34 are divided by a partition plate 49 into an upper rectangular waveguide 42 and a lower rectangular waveguide 43. That is, the microwave power divider 21 includes: the rectangular waveguides (33, 34) connected to the single microwave power source 101; the circular waveguides (29a, 29b) connected to the rectangular waveguides (33, 34); and the radiation sections (217, 218) connected between the circular waveguides (29a, 29b) and the process chamber 23. The rectangular waveguide a33 can also be referred to as a first rectangular waveguide while the rectangular waveguide b34 can also be referred to as a second waveguide.

The microwave power from a magnetron 101 is divided by the partition plate 49 into the upper rectangular waveguide 42 and the lower rectangular waveguide 43. The upper rectangular waveguide 42 further includes a power gate 31 which is made of a dielectric material and serves to regulate the microwave power passing through the upper rectangular waveguide 42. A dielectric body having a relative permittivity of 4 or so is preferred. In this example, therefore, the power gate 31 made of quartz glass (relative permittivity εr=3.78) is used. As shown in FIG. 3, a pair of constriction sections 30 in a trapezoidal shape are disposed in a side wall of the upper waveguide 42 in face-to-face alignment so as to cut off the power passing through the upper rectangular waveguide 42. The pair of constriction sections 30 can be referred to as a cutoff section for cutting off the power passing through the upper rectangular waveguide 42. As seen in plan view or top view, a width between the pair of constriction sections 30 as the cutoff section is defined to be less than a width of a rectangular waveguide (33) excluding the pair of constriction sections 30.

The insertion of the power gate 31 between the constriction sections 30 permits the passage of the microwaves cut off by the constriction sections 30 of the upper rectangular waveguide 42. The power of the microwaves entering the circular inner waveguide 29a from the upper rectangular waveguide 42 can be regulated by adjusting an insertion length 700 of the power gate 31. As shown in FIG. 3, the constriction section 30 is basically characterized in that opposite oblique sides 301, 302 are in an asymmetric relation. Because of this configuration, the reflection of the microwaves to the microwave power source 101 can be reduced. In addition, this configuration is effective to smoothen impedance change such that the circular polarized waves are synthesized by the rectangular waveguide a33 and the rectangular waveguide b34 in orthogonal relation.

For the purposes of increasing the axial ratio of the circular polarized waves and reducing the reflection of the circular polarized waves to the microwave power source 101, a cylindrical dielectric waveguide 36 is disposed between the upper rectangular waveguide 42 and the inner waveguide 29a, as shown in FIG. 3 and FIG. 4. The dielectric waveguide 36 is disposed at the upper rectangular waveguide 42. The dielectric waveguide 36 can be formed of quartz glass. As shown in FIG. 3, the dielectric waveguide 36 is configured such that the center axis thereof is out of alignment (misaligned) with the center axis of the rectangular waveguide a33 and the center axis of the rectangular waveguide b34. Further, as shown in FIG. 4, a predetermined gap 47 for reactance adjustment is defined between a top side of the dielectric waveguide 36 and a top side of the upper rectangular waveguide 42. Assuming that the lengths L1, L2, L3 shown in FIG. 3 are 0.5λd, 1.125λd and 1.0λd, respectively, circular polarized waves in the TE11 mode can be synthesized by the rectangular waveguide a33 and the rectangular waveguide b34 in orthogonal relation. In the case of 2.45 GHz and WR1-22 standard waveguide, λd is 148 mm. The length L1 denotes a distance between the center axis of the dielectric waveguide 36 and a first side wall 34a of the rectangular waveguide b34. The length L2 denotes a distance between the center axis of the dielectric waveguide 36 and a second side wall 34b opposed to the first side wall 34a of the rectangular waveguide b34. The length L3 denotes a distance between the center axis of the dielectric waveguide 36 and a first side wall 33a. The length L4 denotes a distance between the center axis of the dielectric waveguide 36 and an end 33b opposed to the first side wall 33a of the long rectangular waveguide a33. In this example, a relation (L1+L2)<(L3+L4) exists between the length (L1+L2) of the short rectangular waveguide b34 and the length (L3+L4) of the long rectangular waveguide a33. The first side wall 34a and the second side wall 34b of a rectangular waveguide b34 are pair of side walls opposed to each other in a longitudinal direction of the rectangular waveguide b34. The first side wall 33a and the end 33b of the rectangular waveguide a33 are opposed to each other in a longitudinal direction of the rectangular waveguide a33.

The microwave power passing through the upper rectangular waveguide 42 can be regulated by means of the insertion length 700 of the power gate 31 in the constriction sections 30 of the upper rectangular waveguide 42. Further, the circular polarized waves are synthesized by an intersection 35 between the rectangular waveguide a33 and the rectangular waveguide b34 in orthogonal relation so that the circular polarized microwaves of different power ratios can be injected into an inside and an outside of the process chamber 23. The plasma density distribution in the process chamber 23 can be continuously controlled to be "centrally high density", "circumferentially high density", and "even density distribution" by means of the different inside-to-outside microwave power ratios.

As shown in FIG. 5A, the power gate 31 includes: a trapezoidal section 57 shaped like a trapezoid including an upper bottom 57a and a lower bottom 57b; and a rectangular insertion section 58 connected to the upper bottom 57a of the trapezoidal section 57. The insertion section 58 is configured to be inserted into the constriction section 30 of the upper rectangular waveguide 42. The insertion section 58 has an end face 58b level to or parallel to the upper bottom 57a or the lower bottom 57b of the trapezoidal section 57.

As shown in FIG. 5B, a power gate 31a according to a modification includes the trapezoidal section 57 shaped like a trapezoid including an upper bottom 57a and a lower bottom 57b; and an insertion section 58a connected to the upper bottom 57a of the trapezoidal section 57. The insertion section 58a includes an end face 58c having a predetermined angle 59 to the upper bottom 57a or the lower bottom 57b of the trapezoidal section 57. The end face 58a has an effect to reduce the reflection of the microwaves to the microwave power source 101.

Figure 7:
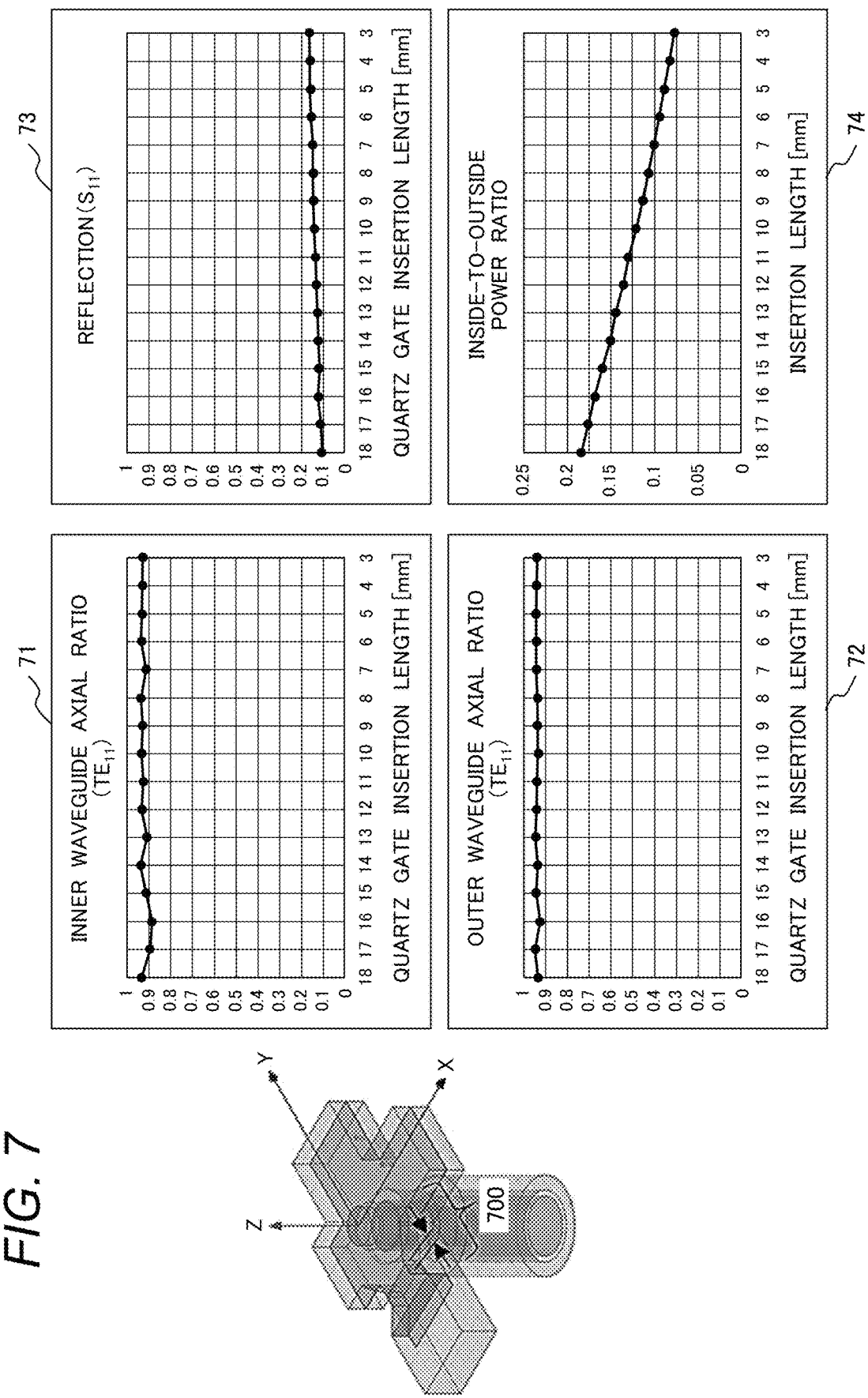
FIG. 7 is a set of graphs showing simulation results of a finite element method (HFSS) according to the present invention.

FIG. 7 is graphs showing simulation results of a finite element method (HFSS) according to the present invention. FIG. 7 shows the simulation results of the finite element method where 2.45-GHz microwaves from the microwave power source 101 are inputted to the microwave power divider 21 and where the insertion length 700 of the power gate 31 is varied. FIG. 7 includes a graph 71 showing the variations of the axial ratio of the circular polarized waves radiated from the inner waveguide 29a; a graph 72 showing the variations of the axial ratio of the circular polarized waves radiated from the outer waveguide 29b; a graph 73 showing the reflection to the microwave power source 101; and a graph 74 showing the power ratio between the inner waveguide 29a and the outer waveguide 29b. It is confirmed that the inside-to-outside power ratio can be controlled within a linear range of 0.18 to 0.078 by means of the insertion length 700 of the power gate 31. In addition, it is also confirmed that the axial ratio of 0.9 or more is maintained between the inner waveguide 29a and the outer waveguide 29b while the reflection is reduced to 0.2 or less.

The ECR plasma etching apparatus 100 according to the present invention has the following configuration.

As shown in FIG. 2, the microwave power divider 21 is equipped with a function of the circular polarized wave generator. Furthermore, a waveguide configuration capable of generating the circular polarized wave according to the circular polarized wave generator 19 of a comparative example is externally mounted to the ECR plasma etching apparatus 100 as a waveguide of a microwave introduction section of the ECR plasma etching apparatus 100. This permits the apparatus to flexibly respond to the change in the plasma density distribution in the process chamber 23 according to a processing condition.

The microwave power divider 21 is configured using the long rectangular waveguide 33 connected to the magnetron as the single microwave power source 101, and the short rectangular waveguide 34 orthogonal thereto (or intersecting therewith). The circular polarized waves are formed in each of the inner waveguide 29a and the outer waveguide 29b vertically connected to the rectangular waveguides 33, 34 by adjusting the lengths of these two rectangular waveguides 33, 34 and controlling the phase of the TE10 mode microwaves coming into the rectangular waveguides 33, 34. The two rectangular waveguides 33, 34 in orthogonal relation are provided with the partition plate 49 so that the rectangular waveguides 33, 34 are vertically divided. The power from the single microwave power source 101 can be divided into halves. An upper part of the rectangular waveguide vertically divided by the partition plate 49 is defined as the upper rectangular waveguide 42 and a lower part of the divided rectangular waveguide is defined as the lower rectangular waveguide 43. Further, a ratio of the microwave power divided into halves can be adjusted by changing the height of the partition plate 49.

The upper rectangular waveguide 42 and the lower rectangular waveguide 43 vertically divided by the partition plate 49 are respectively connected to the circular inner waveguide 29a and the circular outer waveguide 29b to define a double waveguide structure. This double waveguide structure is large in diameter. Therefore, the cylindrical dielectric waveguide 36, formed of quartz glass, is loaded between the upper rectangular waveguide 42 and the circular inner waveguide 29a so that the wavelength of the microwaves can be compressed. This is advantageous in that the diameter of the double waveguide structure can be designed small. Further, an effect to reduce the microwave reflection to the microwave power source 101 can be produced by slightly displacing the center axis of the dielectric waveguide 36 as the quartz waveguide from the center axes of the rectangular waveguides 33, 34. What is more, the circular polarized waves can also be formed in the circular outer waveguide 29b.

To limit the propagation of the microwaves of the inner waveguide 29a, a radius "a" of the inner waveguide 29a is designed based on an equation (1) so that the microwaves can pass through the inner waveguide or the inner waveguide can cut off the microwaves.

$$a=(1.841C)/(2\pi fc)[m] \quad (1)$$

where "fc" denotes a microwave frequency of 2.45 GHz and "C" denotes a light speed in vacuo $2.99\times10^8$ m/s.

In a case where the microwaves in the TE11 mode propagate through a medium such as air or vacuum, for example, a value of the relative permittivity εr of the medium is 1. According to the equation (1), a radius of the inner waveguide 29a is 0.0375 m. In a case where quartz is used as a material of the dielectric waveguide 36 in the inner waveguide 29a and a value of the relative permittivity εr of the quartz is 3.78, a propagation velocity of the microwave is lowered to 1/√εr. According to the equation (1), a radius of the inner waveguide 29a is 0.018 m.

The outer waveguide 29b is configured to be coaxial with the inner waveguide 29a. The dielectric waveguide 36 is configured to have a center axis aligned with those of the outer waveguide 29b and the inner waveguide 29a. Therefore, the outer waveguide 29b propagates the microwaves as a waveguide coaxial with the inner waveguide 29a. The coaxial waveguide has no shield against the microwaves in the TEM mode as a basic mode. However, when shielding the waves in the TE11 mode higher than the TEM mode, a radius b of the outer waveguide 29b can be determined using the following equation (2).

$$20kc\approx 2/(a+b) \quad (2)$$

where "kc" denotes a cut-off frequency [rad/m], "a" denotes a radius [m] of the inner waveguide 29a, and "b" denotes a radius [m] of the outer waveguide 29b.

By phase manipulation based on the length of the two rectangular waveguides 33, 34 in orthogonal relation, circular polarized waves can be formed in each of the inner waveguide 29a and the outer waveguide 29b, which constitute the double waveguide as divided by the partition plate 49. Although the lowest mode of the outer waveguide 29b, which is a coaxial waveguide, is the TEM mode, the TEM mode can be removed by the ring-shaped outer radiation section 218 connected to the outer waveguide 29b. Therefore, the axial ratios of the circular polarized waves formed in the respective inner waveguide 29a and the outer waveguide 29b were evaluated by using S parameters in the TE11 mode (see the graphs 71, 72 of FIG. 7). It is noted that a circular polarized wave having an axial ratio of 1 means a perfect circular polarized wave while a circular polarized wave having an axial ratio of 0 means a linear polarized wave.

For regulation of the microwave power radiated from the inner waveguide (circular section) 29a and the outer waveguide (coaxial section) 29b, a pair of constriction sections 30 capable of cutting off the microwaves is disposed at a microwave incidence side of the upper rectangular waveguide 42 connected to the inner waveguide 29a. The upper rectangular waveguide 42 is decreased in width by the pair of constriction sections 30, so that the microwaves from the microwave power source 101 are cut off, resulting in power transmission failure. However, a quartz block (power gate) 31 slidably movable back and forth is disposed between the pair of constriction sections 30. The microwave power passing through the upper rectangular waveguide 42 can be regulated by moving back and forth the power gate 31.

The following effects can be achieved by the present invention.

The electric power through the upper rectangular waveguide 42 can be regulated by slidably moving the power gate 31 back and forth in the horizontal direction. Furthermore, the two rectangular waveguides 33, 34 are arranged in orthogonal relation. Therefore, the circular polarized waves can be formed in the inner waveguide 29a and the outer waveguide 29b connected to the rectangular waveguides 33, 34 by adjusting the lengths of the two rectangular waveguides 33, 34.

The electric power of the inner waveguide 29a is supplied from the inner radiation section 217 to the process chamber 23. On the other hand, the electric power of the outer waveguide 29b is once supplied to a cavity such as the ring-shaped outer radiation section 218 before radiated to the process chamber 23. The outer waveguide (coaxial section) 29b is the coaxial waveguide and hence, the lowest mode thereof is the TEM mode. Therefore, the TEM mode power infiltrates the output end of the outer waveguide (coaxial section) 29b so that the axial ratio of the circular polarized waves decreases at the radiation end of the outer waveguide 29b. However, the infiltrative microwaves in the TEM mode are removed by utilizing the cavity resonance effect of the ring-shaped outer radiation section 218. The TEM mode waves in the outer waveguide 29b can be removed by the ring-shaped outer radiation section 218. Hence, the axial ratio of the outer waveguide 29b is evaluated by using the S parameter in the TE11 mode.

The inner radiation section 217 is configured to define a space having a larger diameter than that of the inner waveguide 29a, so that a wave mode other than the TE11 mode can be established in the inner radiation section 217 as well. This electric field can be temporarily rotated. Therefore, the electric field can reduce the influence of the reflective waves in the TE11 mode. While the inner radiation section 217 illustrated herein defines a cylindrical space, the inner radiation section may have any configuration that permits the establishment of higher order mode than the TE11 mode, such as rectangular parallelepiped or polygons including hexahedron, octahedron, and the like.

According to the above-described configuration, even the microwave power from the single microwave power source 101 is divided into halves when supplied to the process chamber 23. Further, the power of the inner waveguide 29a is controlled by means of the insertion length 700 of the power gate 31. During the etching process of the semiconductor device, therefore, the plasma distribution in the process chamber 23 can be adapted to a desired etching rate by controlling the insertion length 700 of the power gate 31. Accordingly, the non-uniformity of the plasma distribution in the process chamber 23 of the plasma etching apparatus 100 can be reduced. Further, the plasma density distribution in the process chamber 23 can be adjusted to "centrally high density", "circumferentially high density", or "even density distribution" according to a desired etching process.

Example 2

The power gate 31 of Example 1 shown in FIG. 3 and FIG. 4 illustrates the exemplary configuration of the power gate 31 formed of quartz glass in order to be adapted to the microwave power source 101 of 2.45 GHz. If the microwave power source 101 is at a different frequency, the material and configuration of the power gate 31 may be changed according to the frequency in question. In the case of the 2.45-GHz microwave power, a material such as alumina, MC nylon resin, fluorine resin, or the like can be used if the power gate 31 has a relative permittivity ($\varepsilon r$) of 4 or so.

While Example 1 illustrates the exemplary configuration where the power gate 31 and the constriction sections 30 are disposed at the upper rectangular waveguide 42, the present invention is not limited to this. The power gate 31 and the constriction sections 30 can be disposed only at the lower rectangular waveguide 43 rather than the upper rectangular waveguide 42. Furthermore, the power gate 31 and the constriction portions 30 can also be provided at both the upper rectangular waveguide 42 and the lower rectangular waveguide 43.

The gap 47 shown in FIG. 4 is provided for adjusting the axial ratio of the circular polarized waves formed by the reflective wave power, the adjustment made according to the density of plasma in the process chamber 23. The spacing or size of the gap 47 can also be adjusted by changing the height of the dielectric waveguide 36.

Example 3

In the upper rectangular waveguide 42 and the lower rectangular waveguide 43 shown in FIG. 4, the axial ratio of the circular polarized waves in the upper and the lower rectangular waveguides (42, 43) may sometimes be decreased by the impedance change induced by the plasma density in the process chamber 23 shown in FIG. 2. Therefore, a circular cylinder or projection made of a metal or dielectric body and having a diameter Ø of 3 to 5 mm and a length of 5 to 18 mm is disposed at one or more suitable places in the upper and lower rectangular waveguides 42, 43. The impedance values of these waveguides are matched to make a minor adjustment of the axial ratio of the circular polarized waves in the upper rectangular waveguide 42 and the lower rectangular waveguide 43.

Example 4

Figure 6:
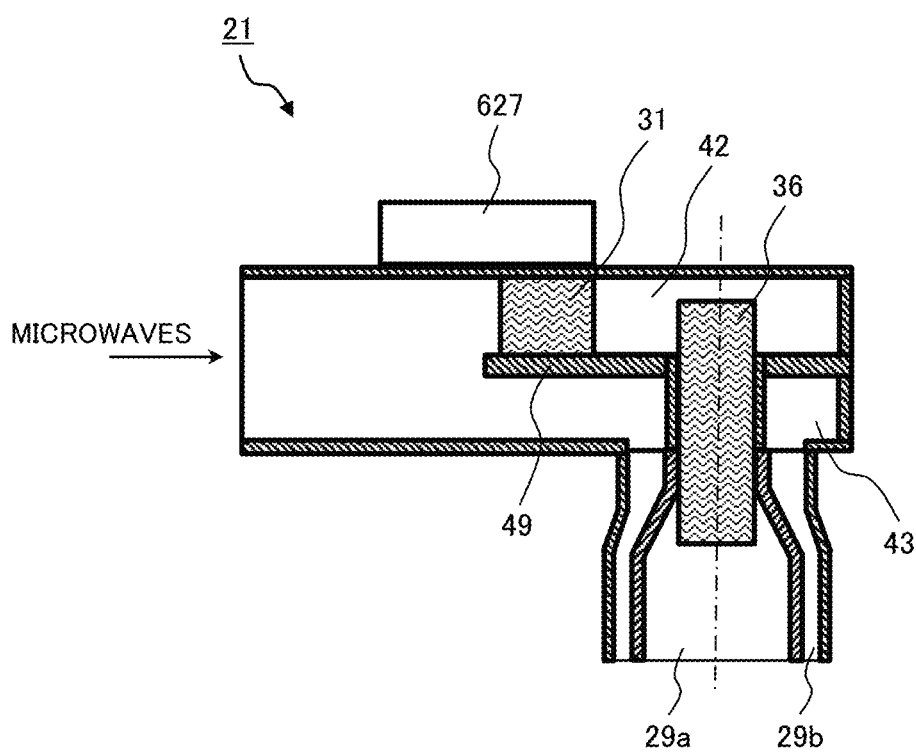
FIG. 6 is a schematic configuration diagram showing a power gate drive mechanism according to the present invention.

FIG. 6 is a schematic configuration diagram showing a power gate drive mechanism according to the present invention. It is preferred to slidably move the power gate 31 to place in the upper rectangular waveguide 42, namely between the constriction sections 30 shown in FIG. 3. It is therefore preferred to provide an actuator 627 as a moving mechanism for slidably moving the power gate 31 to place between the constriction sections 30, as shown in FIG. 6. The actuator 627 is connected to a process control PC (Personal Computer, not shown) or a WS (Workstation, not shown) so that the actuator 627 is configured to move the power gate 31 to place between the constriction sections 30. The configuration permits the insertion length 700 of the power gate 31 in between the constriction sections 30 of FIG. 3 to be changed as desired. Therefore, desired microwaves at different kinds of power can be inputted into the process chamber 23. As a result, the plasma density distribution in the process chamber 23 of the ECR plasma processing apparatus 100 can be controlled as desired.

The preferred embodiments of the plasma processing apparatus according to the example can be summarized as follows.

1) The plasma processing apparatus (100) includes: the process chamber (23) where the specimen (20) is plasma treated; a radio frequency power source (101) for supplying the microwave frequency power for plasma production; the rectangular waveguides (33, 34) for transmitting the microwaves; the circular waveguides (29a, 29b) connected to the rectangular waveguides and transmitting the microwaves to the process chamber; and the specimen support (26) on which the specimen is placed.

The rectangular waveguide (33, 34) includes: the upper rectangular waveguide (42) and the lower rectangular waveguide (43) which are vertically partitioned; and the cutoff section (30) which cuts off the radio frequency power of microwaves supplied from the radio frequency power source and is provided with the dielectric body (31).

The circular waveguide (29a, 29b) includes: the inner waveguide (29a) connected to the upper rectangular waveguide (42) and formed inside; and the outer waveguide (29b) connected to the lower rectangular waveguide (43) and formed on the outer side of the inner waveguide.

The width of the cutoff section (30) is smaller than the width of the rectangular waveguides (33) other than the cutoff section (30).

2) According to the above paragraph 1), the rectangular waveguide (33, 34) includes: the first rectangular waveguide (33), and the second rectangular waveguide (34) orthogonal to the first rectangular waveguide.

3) According to the above paragraph 2), the inner waveguide (29a) includes the dielectric waveguide (36).

4) According to the above paragraph 3), the center axis of the dielectric waveguide (36) as seen in plan is out of alignment with the center axis of the first rectangular waveguide (33) and the center axis of the second rectangular waveguide (34) as seen in the above plan.

5) According to the above paragraph 1), the dielectric body (31) is disposed at the upper rectangular waveguide.

6) According to the above paragraph 3), the dielectric body (31) is disposed at the upper rectangular waveguide.

7) According to the above paragraph 1), the plasma processing apparatus further includes the moving mechanism (627) for moving the dielectric body (31).

While the present invention made by the inventors has been specifically described based on the examples thereof, it is to be understood that the present invention is not limited to the foregoing embodiments and examples. As a matter of course, the present invention may include a variety of modifications.

REFERENCE SIGNS LIST

20 . . . processed substrate
21 . . . microwave power divider
22 . . . electromagnetic coil
23 . . . process chamber
25 . . . quartz window
26 . . . lower electrode
27 . . . RF power source
101 . . . magnetron (microwave power source, radio frequency power source)
217 . . . inner radiation section
218 . . . ring-shaped outer radiation section
29a . . . circular inner waveguide
29b . . . circular outer waveguide
30 . . . constriction section
31 . . . quartz gate (power gate)
33 . . . rectangular waveguide a
34 . . . rectangular waveguide b
36 . . . dielectric waveguide
42 . . . upper rectangular waveguide
43 . . . lower rectangular waveguide
47 . . . gap
49 . . . partition plate
57 . . . trapezoidal section
58 . . . insertion section
627 . . . actuator (moving mechanism)
700 . . . insertion length

The invention claimed is:

1. A plasma processing apparatus comprising:
a process chamber in which a specimen is plasma treated;
a radio frequency power source for supplying microwave frequency power for plasma production;
a rectangular waveguide for transmitting microwaves;
a circular waveguide connected to the rectangular waveguide and transmitting the microwaves to the process chamber; and
a specimen support on which a specimen is placed,
wherein the rectangular waveguide includes: an upper rectangular waveguide and a lower rectangular waveguide formed by vertically dividing the rectangular waveguide; and a cutoff section which cuts off the microwave frequency power supplied from the radio frequency power source, and which is provided with a dielectric body,
the circular waveguide includes: an inner waveguide connected to the upper rectangular waveguide and formed inside; and an outer waveguide connected to the lower rectangular waveguide and formed on an outer side of the inner waveguide, and
a width of the cutoff section is narrower than those of the rectangular waveguides except the cutoff section.

2. The plasma processing apparatus according to claim 1, wherein the rectangular waveguide includes: a first rectangular waveguide; and a second rectangular waveguide orthogonal to the first rectangular waveguide.

3. The plasma processing apparatus according to claim 2, wherein the inner waveguide includes a dielectric waveguide.

4. The plasma processing apparatus according to claim 3, wherein a center axis of the dielectric waveguide as seen in plan is out of alignment with a center axis of the first rectangular waveguide and a center axis of the second rectangular waveguide as seen in the plan.

5. The plasma processing apparatus according to claim 1, wherein the dielectric body is disposed at the upper rectangular waveguide.

6. The plasma processing apparatus according to claim 3, wherein the dielectric body is disposed at the upper rectangular waveguide.

7. The plasma processing apparatus according to claim 1, further comprising a moving mechanism for moving the dielectric body.

\* \* \* \* \*